(12) United States Patent
Yamazaki

(10) Patent No.: US 12,096,556 B2
(45) Date of Patent: Sep. 17, 2024

(54) INTERCONNECT SUBSTRATE AND METHOD OF MAKING THE SAME

(71) Applicant: SHINKO ELECTRIC INDUSTRIES CO., LTD., Nagano (JP)

(72) Inventor: Yuta Yamazaki, Nagano (JP)

(73) Assignee: SHINKO ELECTRIC INDUSTRIES CO., LTD., Nagano (JP)

( * ) Notice: Subject to any disclaimer, the term of this patent is extended or adjusted under 35 U.S.C. 154(b) by 99 days.

(21) Appl. No.: 17/805,094

(22) Filed: Jun. 2, 2022

(65) Prior Publication Data

US 2022/0394851 A1    Dec. 8, 2022

(30) Foreign Application Priority Data

Jun. 8, 2021   (JP) .................................. 2021-096076

(51) Int. Cl.
| | |
|---|---|
| *H05K 1/03* | (2006.01) |
| *H05K 1/11* | (2006.01) |

(52) U.S. Cl.
CPC .......... *H05K 1/115* (2013.01); *H05K 1/0306* (2013.01); *H05K 1/0313* (2013.01); *H05K 1/111* (2013.01); *H05K 1/11* (2013.01)

(58) Field of Classification Search
CPC ...... H05K 1/115; H05K 3/388; H05K 3/4661; H05K 3/4673
See application file for complete search history.

(56) References Cited

U.S. PATENT DOCUMENTS

| | | | | |
|---|---|---|---|---|
| 6,242,078 B1* | 6/2001 | Pommer | .............. | H05K 1/0366 |
| | | | | 428/209 |
| 9,875,957 B2* | 1/2018 | Shimizu | ............... | H05K 3/4644 |
| 2010/0326709 A1* | 12/2010 | Kawano | ................ | H05K 3/421 |
| | | | | 174/257 |
| 2019/0132962 A1 | 5/2019 | Harazono et al. | | |
| 2020/0135648 A1* | 4/2020 | Kandanur | ............ | H01L 21/481 |

FOREIGN PATENT DOCUMENTS

| | | |
|---|---|---|
| JP | 2001-326466 | 11/2001 |
| JP | 2019-083303 | 5/2019 |

OTHER PUBLICATIONS

Office Action mailed on Jul. 23, 2024 issued with respect to the basic Japanese Application No. 2021-096076.

* cited by examiner

*Primary Examiner* — Ishwarbhai B Patel
(74) *Attorney, Agent, or Firm* — IPUSA, PLLC

(57) ABSTRACT

A interconnect substrate includes an insulating layer including an organic resin layer and a plurality of embedded portions that are embedded in the organic resin layer and exposed at an upper surface of the organic resin layer, and an interconnect layer in contact with the upper surface of the organic resin layer and an upper surface of the embedded portions, wherein the embedded portions are made of an oxide, nitride, or oxynitride of inorganic material, and wherein the upper surface of the organic resin layer is partially exposed in areas where the interconnect layer is not formed on the insulating layer.

7 Claims, 4 Drawing Sheets

INTERCONNECT SUBSTRATE AND METHOD OF MAKING THE SAME

CROSS-REFERENCE TO RELATED APPLICATIONS

The present application is based on and claims priority to Japanese Patent Application No. 2021-096076 filed on Jun. 8, 2021, with the Japanese Patent Office, the entire contents of which are incorporated herein by reference.

FIELD

The disclosures herein relate to an interconnect substrate and a method of making an interconnect substrate.

BACKGROUND

An interconnect substrate as known in the art has interconnect layers and insulating layers alternately laminated one over another. As an example, an interconnect substrate may have an insulating intermediate layer formed on an insulating layer made of an epoxy-based resin or the like, with an interconnect layer formed on the insulating intermediate layer. In this interconnect substrate, the insulating intermediate layer is made of an inorganic material such as aluminum oxide, ceramic, silicon oxide, silicon nitride, or the like, which has better adhesion to the interconnect layer than an insulating layer containing an organic material (for example, see Patent Document 1).

During a heating process in the manufacturing process of an interconnect substrate, moisture and volatile components in an insulating layer containing an organic material may vaporize, resulting in the generation of a gas. In the interconnect substrate described above, the insulating intermediate layer made of an inorganic material is formed over the entire upper surface of the insulating layer containing an organic material. Because of this, there is no path for the generated gas to escape, and the gas may accumulate in the insulating layer to cause expansion, etc.

Accordingly, there may be a need to provide an interconnect substrate for which adhesion to an interconnect layer is secured, and for which an escaping path for a gas generated inside an insulating layer is provided.

RELATED-ART DOCUMENTS

[Patent Document 1] Japanese Laid-open Patent Publication No. 2001-326466

SUMMARY

According to an aspect of the embodiment, an interconnect substrate includes an insulating layer including an organic resin layer and a plurality of embedded portions that are embedded in the organic resin layer and exposed at an upper surface of the organic resin layer, and an interconnect layer in contact with the upper surface of the organic resin layer and an upper surface of the embedded portions, wherein the embedded portions are made of an oxide, nitride, or oxynitride of inorganic material, and wherein the upper surface of the organic resin layer is partially exposed in areas where the interconnect layer is not formed on the insulating layer.

The object and advantages of the embodiment will be realized and attained by means of the elements and combinations particularly pointed out in the claims. It is to be understood that both the foregoing general description and the following detailed description are exemplary and explanatory and are not restrictive of the invention, as claimed.

DESCRIPTION OF EMBODIMENTS

In the following, embodiments will be described by referring to the accompanying drawings. In these drawings, the same elements are referred to by the same references, and a duplicate description thereof may be omitted.

[Structure of Interconnect Substrate]

Figure 1A:
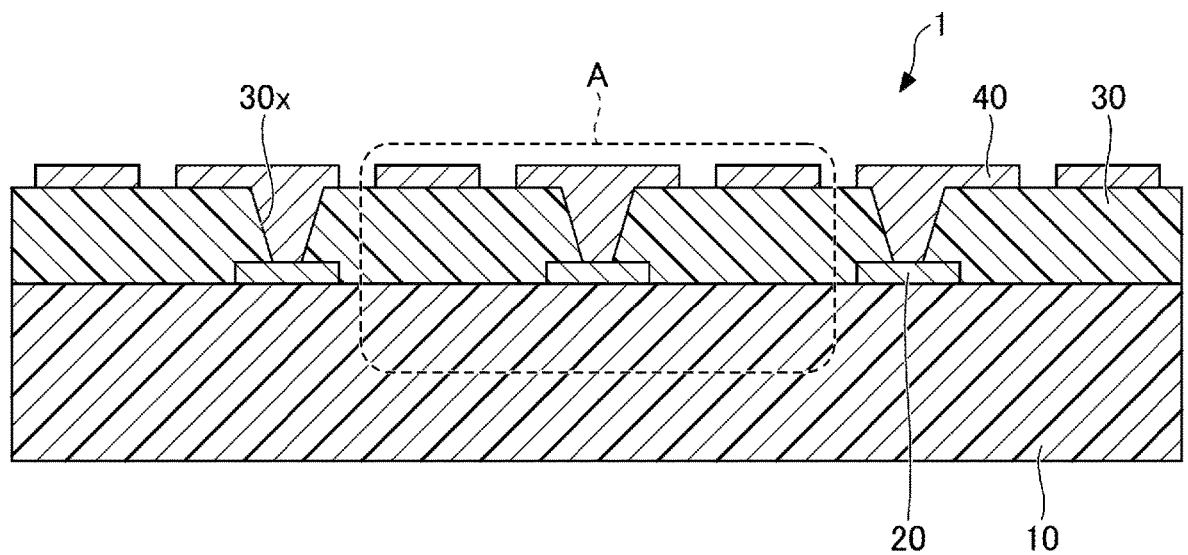
FIGS. 1A and 1B are cross-sectional views illustrating an example of an interconnect substrate according to an embodiment.
Figure 1B:
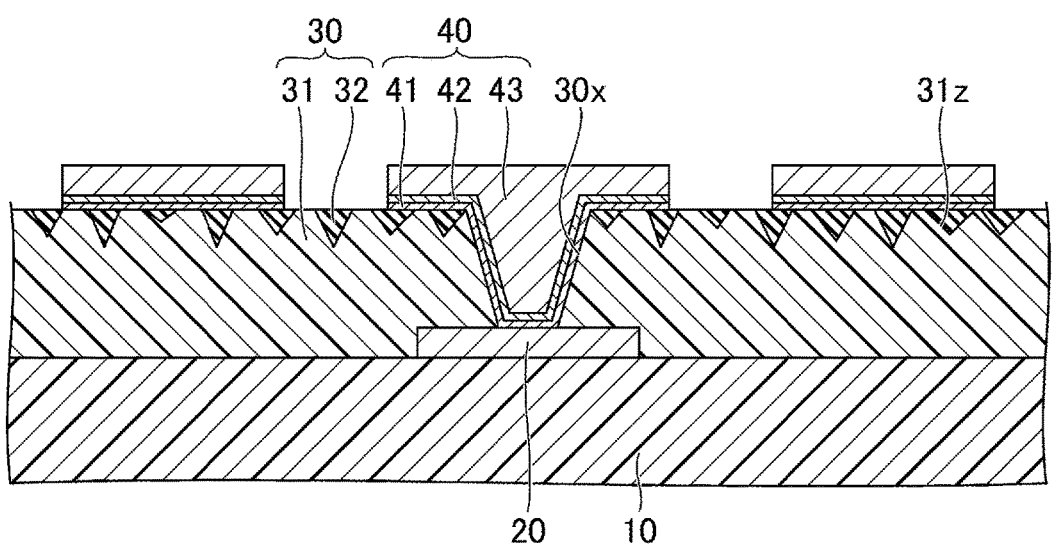

FIGS. 1A and 1B are cross-sectional views illustrating an example of an interconnect substrate according to the present embodiment. FIG. 1A illustrates an enlarged view of part of the interconnect substrate having an interconnect layer and an insulating layer, and FIG. 1B illustrates an enlarged view of an area A illustrated in FIG. 1A.

As illustrated in FIG. 1A, an interconnect substrate 1 includes an insulating layer 10, an interconnect layer 20, an insulating layer 30, and an interconnect layer 40.

In the present embodiment, for the sake of convenience, the side of the interconnect substrate 1 on which the insulating layer 30 is situated is referred to as an upper side or a first side, and the side on which the insulating layer 10 is situated is referred to as a lower side or a second side. Further, the surface of a member situated on the upper side is referred to as an upper surface or a first surface, and the other surface of the member situated on the lower side is referred to as a lower surface or a second surface. It may be noted, however, that the interconnect substrate 1 may be used in an upside-down position, or may be placed at any angle. Further, a plan view refers to a view taken in the direction perpendicular to an upper surface of the insulating layer 10, and a plan view shape refers to the shape of an object as viewed in the direction perpendicular to the upper surface of the insulating layer 10.

The insulating layer 10 may be formed as an interlayer insulating layer between multi-layered interconnects by using build-up construction, for example. In other words, other interconnect layers and other insulating layers may be stacked under the insulating layer 10. In this case, the insulating layer 10 and other insulating layers may have via holes formed therethrough, through which the interconnect layers may be connected to each other. Alternatively, the insulating layer 10 may be a core substrate or the like serving as a base for forming the interconnect layer 20 and the like. The insulating layer 10 may be a lowermost layer.

Non-photosensitive (thermosetting) epoxy insulating resin or polyimide insulating resin may be used as the material of the insulating layer 10. Alternatively, photosensitive epoxy insulating resin or acrylic insulating resin may be used as the material of the insulating layer 10. The insulating layer 10 may be a glass epoxy substrate or the like. The insulating layer 10 may include filler such as silica (SiO$_2$). The thickness of the insulating layer 10 may be about 10 to 50 µm, for example.

The interconnect layer 20 is formed on the insulating layer 10. Copper (Cu) may be used as the material of the interconnect layer 20. The thickness of the interconnect layer 20 may be about 10 to 20 µm, for example.

The insulating layer 30 is formed on the insulating layer 10 to cover the interconnect layer 20. As illustrated in FIG. 1B, the insulating layer 30 includes an organic resin layer 31 and a plurality of embedded portions 32 that are embedded in the organic resin layer 31 and exposed at the upper surface of the organic resin layer 31. The embedded portions 32 are formed in a plurality of recesses 31z that are formed in the upper surface of the organic resin layer 31. The depth of the recesses 31z is approximately 0.5 µm to 1 µm, for example. The material and thickness of the organic resin layer 31 may be substantially the same as those of the insulating layer 10. The organic resin layer 31 may include filler such as silica (SiO$_2$).

The embedded portions 32 are made of an oxide, nitride, or oxynitride of inorganic material. Examples of the material of the embedded portions 32 include, for example, SiO$_2$, Si$_3$O$_4$, SiN, SiON, TiO$_2$, TiN, TaO$_2$, TaN, and the like. The embedded portions 32 are isolated points scattered across the upper surface of the insulating layer 30 in a plan view. The areas where the upper surface of the organic resin layer 31 is exposed and the areas where the upper surface of the embedded portions 32 is exposed are randomly scattered on the upper surface of the insulating layer 30.

The upper surface of the organic resin layer 31 and the upper surface of the embedded portions 32 are flush with each other, for example. The roughness (Ra) of the upper surface of the insulating layer 30 including both the upper surface of the organic resin layer 31 and the upper surface of the embedded portions 32 may be greater than or equal to 0 nm and less than or equal to 20 nm. The roughness (Ra) of the upper surface of the insulating layer 30 including both the upper surface of the organic resin layer 31 and the upper surface of the embedded portions 32 is preferably greater than or equal to 0 nm and less than or equal to 15 nm, and is more preferably greater than or equal to 0 nm and less than or equal to 10 nm. Ra is one type of numerical value representing surface roughness, and is referred to as arithmetic average roughness. Specifically, Ra is the arithmetic average of the absolute values of height deviations that vary in the measurement area as measured from the mean line. It should be noted that, when fine interconnects need not be formed on the insulating layer 30, the upper surface of the insulating layer 30 may be given any roughness as needed.

The interconnect layer 40 is formed on the first side of the insulating layer 30. The interconnect layer 40 is in contact with the upper surface of the organic resin layer 31 and the upper surface of the embedded portions 32. The upper surface of the organic resin layer 31 is partially exposed in the areas where the interconnect layer 40 is not formed on the insulating layer 30 in a plan view. The interconnect layer 40 includes via interconnects that fill via holes 30x extending through the insulating layer 30 to expose the upper surface of the interconnect layer 20, and also includes pads formed on the upper surface of the insulating layer 30. The pads of the interconnect layer 40 are electrically connected to the interconnect layer 20 through the via interconnects. The shape of the via holes 30x is a frustum of an inverted right circular cone for which the diameter of an opening of the hole toward the interconnect layer 40 is greater than the diameter of a bottom opening of the hole at the upper surface of the interconnect layer 20, for example. The material of the interconnect layer 40 and the thickness of the pads are substantially the same as those of the interconnect layer 20.

The interconnect layer 40 includes an adhesion layer 41, a seed layer 42, and an electroplating layer 43. The seed layer 42 is formed on the adhesion layer 41, and the electroplating layer 43 is formed on the seed layer 42. The thickness of the adhesion layer 41 may approximately be 20 nm to 50 nm, for example. The thickness of the seed layer 42 may approximately be 100 nm to 300 nm, for example. The thickness of the electroplating layer 43 may approximately be 10 µm to 30 µm, for example.

The adhesion layer 41 is an electrically conductive layer in contact with the upper surface of the organic resin layer 31 and the upper surface of the embedded portions 32. The adhesion layer 41 is made of a material that is superior to the seed layer 42 in adhesion to the upper surface of the organic resin layer 31 and the upper surface of the embedded portions 32. When the seed layer 42 is formed of Cu, for example, Ti, Ni, Cr, Al, a Cu—Ni compound, Ta, Au, or the like may be used as the material of the adhesion layer 41, for example. The electroplating layer 43 may be made of Cu, for example.

[Method of Making Interconnect Substrate]

In the following, a description will be given of a method of making an interconnection substrate according to the present embodiment. FIGS. 2A to 2C through FIGS. 4A and 4B are drawings illustrating an example of the process of making the interconnect substrate of the present embodiment. This embodiment is directed to the process steps of making a single interconnect substrate. Alternatively, however, a plurality of structures to serve as respective interconnect substrates may be made as a single piece, followed by being separated into respect interconnect substrates.

Figure 2A:
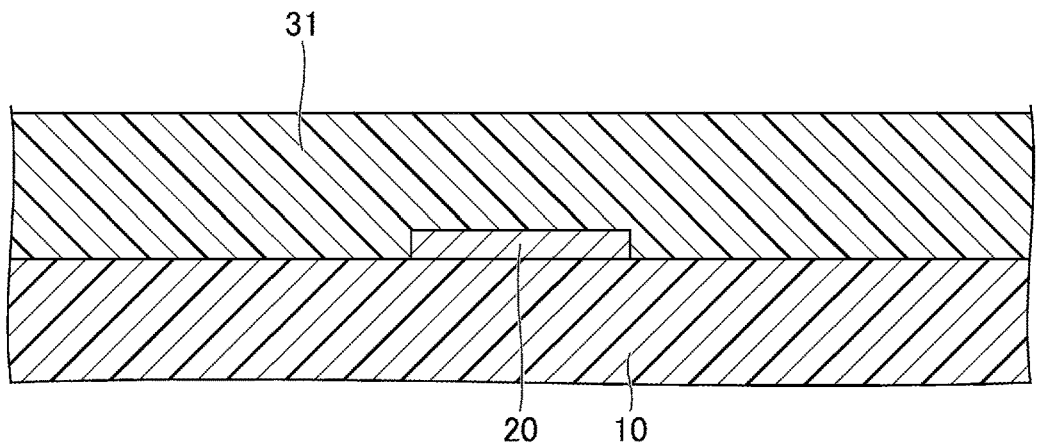
FIGS. 2A through 2C are drawings illustrating an example of the process steps of making the interconnect substrate according to the embodiment.

In the process step illustrated in FIG. 2A, the insulating layer 10 is put in place, and, then, the interconnect layer 20 is formed on the upper surface of the insulating layer 10. To be more specific, a plane copper foil that is not patterned is formed on the upper surface of a glass epoxy substrate or the like serving as the insulating layer 10 to prepare a laminated plate, and, then, the copper foil is patterned into a predetermined plan-view shape by a subtractive method or the like to form the interconnect layer 20, for example. Subsequently, the organic resin layer 31 covering the interconnect layer 20 is formed on the insulating layer 10. Specifically, an epoxy-based insulating resin, a polyimide-based insulating resin, or the like provided as a semi-cured non-photosensitive film (thermosetting resin) is laminated on the upper surface of the insulating layer 10 to cover the interconnect layer 20, followed by being heated and cured to form the organic resin layer 31, for example. Alternatively, an epoxy-based resin or the like in a liquid form or a paste form, in place of the epoxy-based resin film or the like, may be applied, and then cured to form the organic resin layer 31.

Figure 2B:
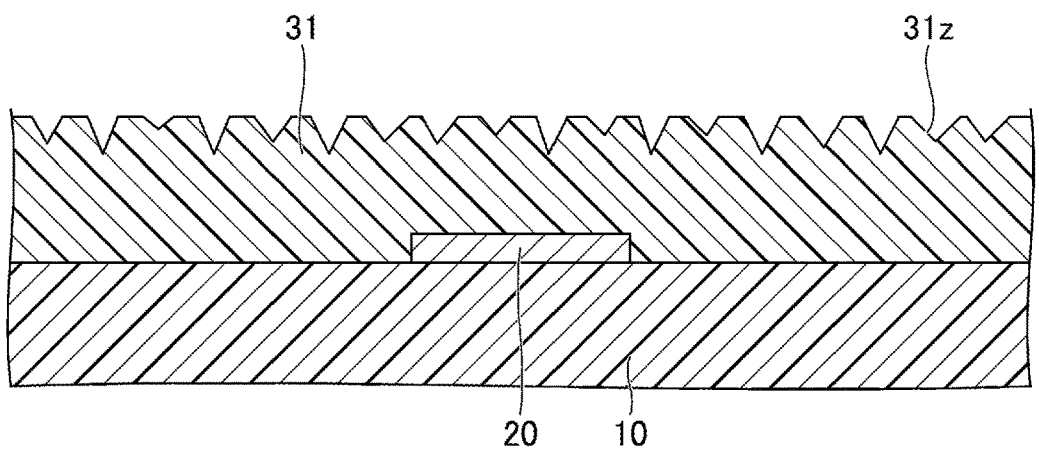

In the process step illustrated in FIG. 2B, the upper surface of the organic resin layer 31 is roughened to form the plurality of recesses 31z in the upper surface of the organic resin layer 31. A large number of recesses 31z are scattered as isolated points on the upper surface of the organic resin layer 31 in the plan view. Roughening of the upper surface of the organic resin layer 31 (i.e., formation of the recesses 31z) can be performed by a plasma process, for example. The plasma process is controlled such that the recesses 31z have a depth of approximately 0.5 to 1 µm, for example, and the upper surface of the organic resin layer 31 has a roughness (Ra) of greater than or equal to 200 nm and less than or equal to 800 nm. Through such a control, the roughness (Ra) of the upper surface of the organic resin layer 31 is preferably greater than or equal to 300 nm and less than or equal to 700 nm, and is more preferably greater than or equal to 400 nm and less than or equal to 600 nm. It may be noted that the method of roughening the upper surface of the organic resin layer 31 is not limited to a plasma process. A chemical solution process or a blasting process may be used in place of a plasma process.

Figure 2C:
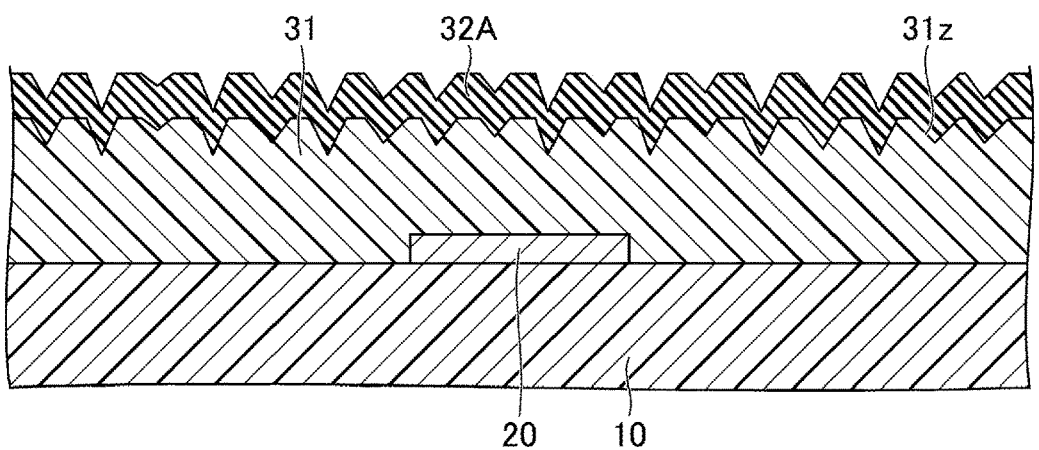

In the process step illustrated in FIG. 2C, an inorganic insulating layer 32A having a sufficient thickness to fill the recesses 31z is formed on the upper surface of the organic resin layer 31. The material of the inorganic insulating layer 32A may be an oxide, nitride, or oxynitride of inorganic material listed as the material of the embedded portions 32. The inorganic insulating layer 32A may be formed by use of a sputtering process, chemical vapor deposition, or the like.

Figure 3A:
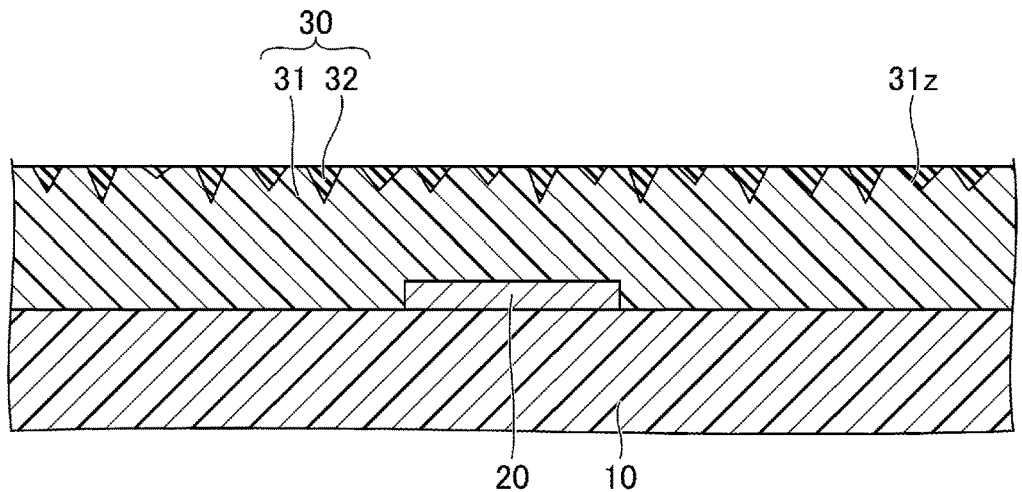
FIGS. 3A through 3C are drawings illustrating an example of the process steps of making the interconnect substrate according to the embodiment.

In the process step illustrated in FIG. 3A, the upper surface of the inorganic insulating layer 32A is polished to expose the upper surface of the organic resin layer 31, thereby forming the insulating layer 30 including the organic resin layer 31 and the embedded portions 32 filling the recesses 31z. Polishing of the inorganic insulating layer 32A may be performed by use of a chemical mechanical polishing (CMP) method, for example. Polishing of the inorganic insulating layer 32A may alternatively be performed by plasma etching. The upper surface of the embedded portions 32 may be set flush with the upper surface of the insulating layer 30, for example.

A portion of the upper surface of the organic resin layer 31 may also be polished and removed at the same time as polishing the inorganic insulating layer 32A. By polishing the upper surface of the organic resin layer 31 together with the inorganic insulating layer 32A to remove a portion of the upper surface of the organic resin layer 31, it is possible to reduce the roughness of the entire upper surface of the insulating layer 30 including the upper surface of the organic resin layer 31 and the upper surface of the embedded portions 32. Namely, the smoothness of the entire upper surface of the insulating layer 30 can be improved.

The roughness (Ra) of the upper surface of the insulating layer 30 including both the upper surface of the organic resin layer 31 and the upper surface of the embedded portions 32 may be greater than or equal to 0 nm and less than or equal to 20 nm. The roughness (Ra) of the upper surface of the insulating layer 30 including both the upper surface of the organic resin layer 31 and the upper surface of the embedded portions 32 is preferably greater than or equal to 0 nm and less than or equal to 15 nm, and is more preferably greater than or equal to 0 nm and less than or equal to 10 nm. As described above, the roughness of the upper surface of the insulating layer 30 is reduced to improve the smoothness, which allows extremely fine interconnects (i.e., an interconnect layer with high-density interconnects) to be formed in a subsequent process step. It should be noted that, when fine interconnects need not be formed, the roughness of the upper surface of the insulating layer 30 may be set to any roughness as needed.

Figure 3B:
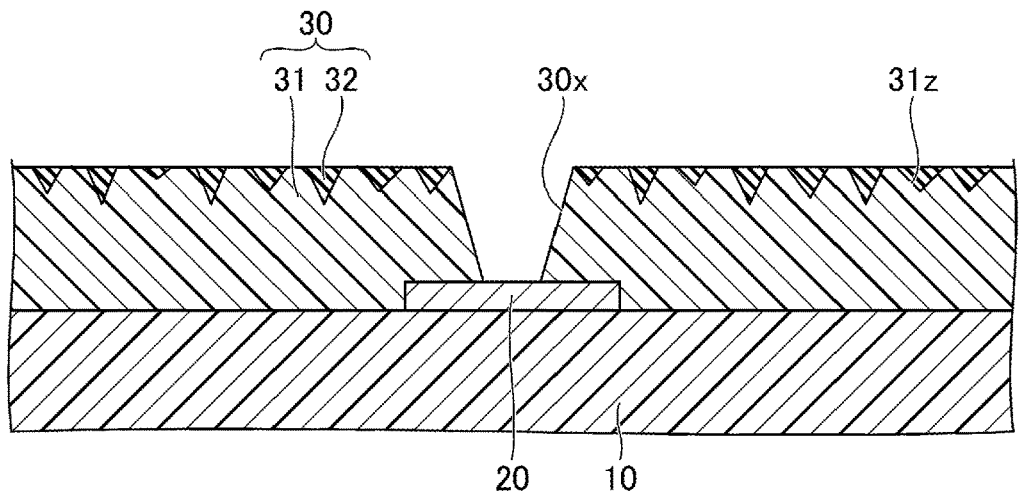

In the step illustrated in FIG. 3B, the via hole 30x is formed in the insulating layer 30 to extend through the insulating layer 30 to expose the upper surface of the interconnect layer 20. The via hole 30x may be formed by a laser process utilizing $CO_2$ laser, YAG laser, excimer laser, or the like, for example. After the formation of the via hole 30x, a desmear process is preferably performed to remove resin residues adhering to the upper surface of the interconnect layer 20 exposed at the bottom of the via hole 30x.

Figure 3C:
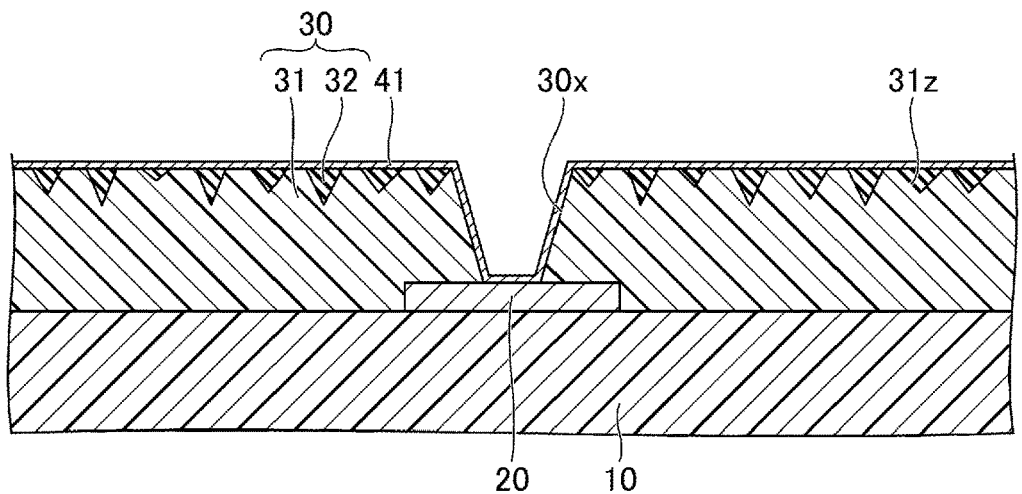

In the process steps illustrated in FIG. 3C through FIG. 4B, a semi-additive method is used to form the interconnect layer 40. Specifically, as illustrated in FIG. 3C, the conductive adhesion layer 41 is formed to extend continuously over the upper surface of the insulating layer 30, the inner wall of the via hole 30x, and the upper surface of the interconnect layer 20 exposed in the via hole 30x by an electroless plating method or a sputtering method. The adhesion layer 41 is formed in contact with the upper surface of the organic resin layer 31 and the upper surface of the embedded portions 32. Ti, Ni, Cr, Al, a Cu—Ni compound, Ta, Au, or the like may be used as the material of the adhesion layer 41, for example. The thickness of the adhesion layer 41 may approximately be 20 nm to 50 nm, for example.

Figure 4A:
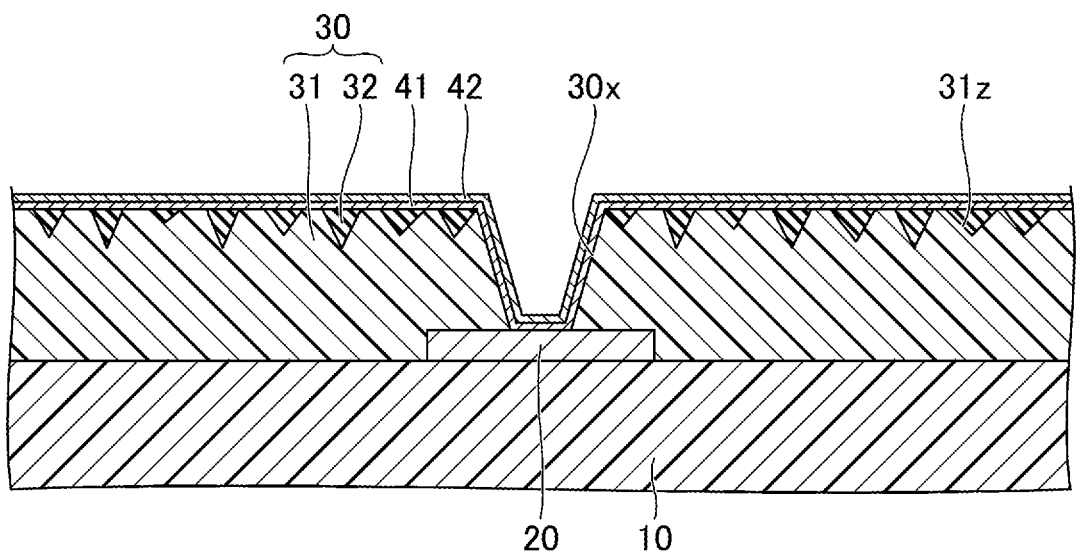
FIGS. 4A and 4B are drawings illustrating an example of the process steps of making the interconnect substrate according to the embodiment.

As illustrated in FIG. 4A, the seed layer 42 is formed to extend continuously over the adhesion layer 41 by an electroless plating method or a sputtering method. Cu or the like may be used as the material of the seed layer 42, for example. The thickness of the seed layer 42 may approximately be 100 nm to 300 nm, for example.

Figure 4B:
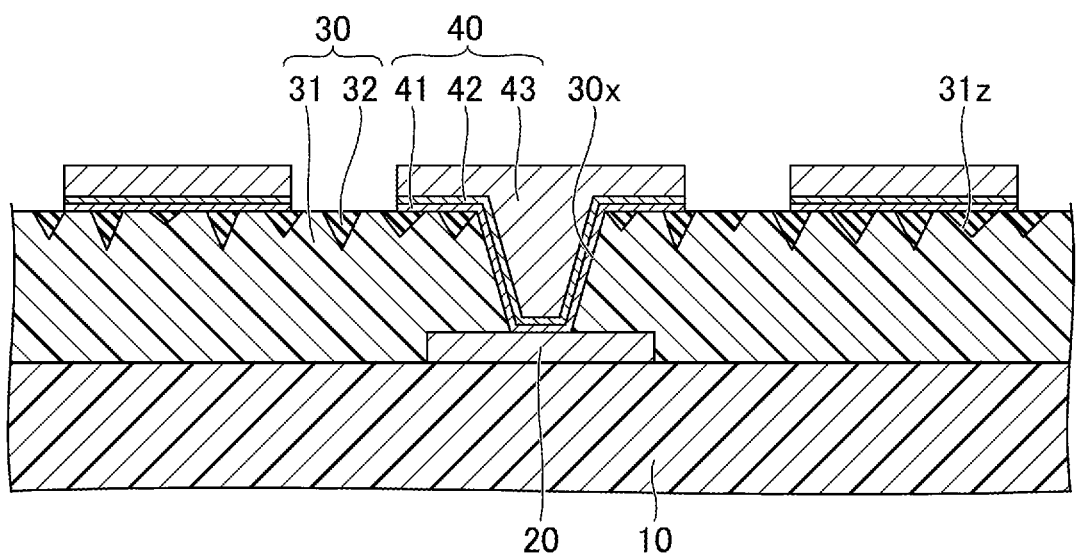

As illustrated in FIG. 4B, the electroplating layer 43 is formed on the seed layer 42 to complete the interconnect layer 40 including the adhesion layer 41, the seed layer 42, and the electroplating layer 43. The electroplating layer 43 may be made of Cu, for example. The thickness of the electroplating layer 43 may approximately be 10 μm to 30 μm, for example. Specifically, a photosensitive resist layer is formed over the entire seed layer 42. The resist layer is then exposed and developed to form openings that expose the portions where the electroplating layer 43 is to be formed. Electrolytic plating is performed by using the seed layer 42 as a power feed layer to form the electroplating layer 43 on the portions of the seed layer 42 that are exposed in the openings. The resist layer is detached, and, then, the electroplating layer 43 is used as a mask to etch and remove the adhesion layer 41 and the seed layer 42 at the places not covered by the electroplating layer 43. With this arrangement, the interconnect layer 40 is formed in contact with the upper surface of the organic resin layer 31 and the upper surface of the embedded portions 32. The upper surface of the organic resin layer 31 is partially exposed at the places where the interconnect layer 40 is not formed on the insulating layer 30 in the plan view. With the process steps described above, the interconnect substrate 1 is completed in final form. Additional insulating layers and interconnect layers may alternately be formed on interconnect layer 40 according to need.

As described heretofore, the interconnect substrate 1 is configured such that the upper surface of the insulating layer 30 has the partially-exposed embedded portions 32 that is made of an oxide, nitride, or oxynitride of inorganic material. The adhesion layer 41, which is the lowest layer of the interconnect layer 40, has a portion in contact with the embedded portions 32. Since inorganic materials are bonded with each other at the interface at which the embedded portions 32 and the adhesion layer 41 come into contact with each other, the adhesion between the insulating layer 30 and the interconnect layer 40 is improved, compared with a case in which the adhesion layer 41 comes into contact with only the organic resin layer 31.

When a heating process is used after the process of forming the insulating layer 30 in the manufacturing process of an interconnect substrate 1, moisture and volatile components in the organic resin layer 31 may vaporize, resulting in the generation of gas. In the interconnect substrate 1, the upper surface of the organic resin layer 31 is partially exposed in the areas where the interconnect layer 40 is not formed on the insulating layer 30 in a plan view. Because of this, any gas generated in the organic resin layer 31 readily escapes from the upper side of the insulating layer 30. This arrangement prevents the gas from accumulating in the organic resin layer 31 and generating swelling or the like. It may be noted that the heating performed after the process of forming the insulating layer 30 includes, for example, an annealing process after plating, a plasma process, and a thermal curing process for the insulating resin of the upper layer.

Namely, the interconnect substrate 1 ensures the adhesion between the insulating layer 30 and the interconnect layer 40, and also takes into consideration the path through which a gas escapes upon being generated in the organic resin layer 31 constituting the insulating layer 30.

In the related-art configuration, the adhesion between the insulating layer and the interconnect layer formed on the insulating layer was improved by roughening the upper surface of the insulating layer. In the case of the interconnect substrate 1, the upper surface of the insulating layer 30 has the partially-exposed embedded portions 32 to improve the adhesion between the insulating layer 30 and the interconnect layer 40, so that there is no need to roughen the upper surface of the insulating layer 30, and, rather, it is possible to smooth the upper surface of the insulating layer 30. For example, the upper surface of the insulating layer 30 may be given the roughness (Ra) that is greater than or equal to 0 nm and less than or equal to 20 nm, thereby allowing the interconnect layer 40 to be extremely fine interconnects (i.e., an interconnect layer with high-density interconnects) while ensuring the adhesion with the interconnect layer 40. The line width and space of the interconnect layer 40 may range approximately from 1 μm and 1 μm, respectively, to 20 μm and 20 μm, respectively. Further, provision of the interconnect layer 40 on the upper surface of the smoothed insulating layer 30 reduces transmission loss with respect to radio frequency signals propagating through the interconnect layer 40.

At least one embodiment provides an interconnect substrate for which adhesion to an interconnect layer is secured, and for which an escaping path for a gas generated inside an insulating layer is provided.

All examples and conditional language recited herein are intended for pedagogical purposes to aid the reader in understanding the invention and the concepts contributed by the inventor to furthering the art, and are to be construed as being without limitation to such specifically recited examples and conditions, nor does the organization of such examples in the specification relate to a showing of the superiority and inferiority of the invention. Although the embodiment(s) of the present inventions have been described in detail, it should be understood that the various changes, substitutions, and alterations could be made hereto without departing from the spirit and scope of the invention.

One aspect of the subject-matter described herein is set out non-exclusively in the following numbered clause.

[Clause 1] A method of making an interconnect substrate, comprising:
forming a plurality of recesses in an upper surface of an organic resin layer by roughening the upper surface of the organic resin layer;
forming an inorganic insulating layer on the upper surface of the organic resin layer, the inorganic insulating layer filling the recesses;
forming an insulating layer including the organic resin layer and embedded portions filling the recesses by polishing an upper surface of the inorganic insulating layer to expose the upper surface of the organic resin layer; and
forming an interconnect layer in contact with the upper surface of the organic resin layer and an upper surface of the embedded portions,
wherein the embedded portions are made of an oxide, nitride, or oxynitride of inorganic material, and
wherein the upper surface of the organic resin layer is partially exposed in areas where the interconnect layer is not formed on the insulating layer.

[Clause 2] The method as recited in clause 1, wherein the forming the interconnect layer includes:
forming an electrically conductive adhesion layer in contact with the upper surface of the organic resin layer and the upper surface of the embedded portions;
forming a seed layer on the adhesion layer; and
forming an electroplating layer on the seed layer.

[Clause 3] The method as recited in clause 1, wherein the forming the insulating layer causes the upper surface of the organic resin layer and the upper surface of the embedded portions to be flush with each other.

[Clause 4] The method as recited in clause 1, wherein the forming the plurality of recesses causes the upper surface of the organic resin layer to have a roughness Ra that is greater than or equal to 200 nm and less than or equal to 800 nm.

[Clause 5] The method as recited in clause 1, wherein the forming the insulating layer causes a roughness Ra of an upper surface of the insulating layer including both the upper surface of the organic resin layer and the upper surface of the embedded portions to be greater than or equal to 0 nm and less than or equal to 20 nm.

What is claimed is:
1. An interconnect substrate, comprising:
an insulating layer including an organic resin layer and a plurality of embedded portions that are embedded in the organic resin layer and exposed at an upper surface of the organic resin layer, the organic resin layer having recesses that are open on the upper surface of the organic resin layer and that are set back in a thickness direction of the organic resin layer, the embedded portions being an inorganic substance filling the recesses; and
an interconnect layer in contact with the upper surface of the organic resin layer and an upper surface of the embedded portions,
wherein the embedded portions are made of an oxide, nitride, or oxynitride of inorganic material,
wherein the upper surface of the organic resin layer is partially exposed in areas where the interconnect layer is not formed on the insulating layer, and
wherein the oxide, nitride, or oxynitride of the inorganic material is unevenly distributed in a thickness direction of the organic resin layer, and is locally present around the upper surface of the organic resin layer,
wherein the interconnect layer includes: an electrically conductive adhesion layer in contact with the upper surface of the organic resin layer and the upper surface of the embedded portions; a seed layer formed on the adhesion layer; and an electroplating layer formed on the seed layer, and
wherein the adhesion layer contains Ti, Ni, Cr, Al, a Cu-Ni compound, Ta, or Au.

2. The interconnect substrate as claimed in claim 1, wherein the upper surface of the organic resin layer and the upper surface of the embedded portions are flush with each other.

3. The interconnect substrate as claimed in claim 1, wherein a roughness Ra of an upper surface of the insulating layer including both the upper surface of the organic resin layer and the upper surface of the embedded portions is greater than or equal to 0 nm and less than or equal to 20 nm.

4. The interconnect substrate as claimed in claim 1, wherein a line width and space of the interconnect layer range from 1 μm and 1 μm, respectively, to 20 μm and 20 μm, respectively.

5. The interconnect substrate as claimed in claim 1, wherein a depth of the embedded portions is 0.5 μm to 1 μm.

6. The interconnect substrate as claimed in claim 1, wherein the inorganic material of the embedded portions includes $SiO_2$, $Si_3O_4$, SiN, SiON, $TiO_2$, TiN, $TaO_2$, or TaN.

7. The interconnect substrate as claimed in claim 1, wherein the embedded portions are isolated portions scattered across the upper surface of the insulating layer, and areas where the upper surface of the organic resin layer is exposed and areas where the upper surface of the embedded portions is exposed are randomly scattered on the upper surface of the insulating layer.

* * * * *